United States Patent
Hayashishita (10) Patent No.: US 10,483,131 B2
(45) Date of Patent: Nov. 19, 2019

(54) ELECTRONIC-DEVICE-PROTECTING FILM, ELECTRONIC-DEVICE-PROTECTING MEMBER, METHOD FOR MANUFACTURING ELECTRONIC DEVICE, AND METHOD FOR MANUFACTURING PACKAGE

(71) Applicant: MITSUI CHEMICALS TOHCELLO, INC., Chiyoda-ku, Tokyo (JP)

(72) Inventor: Eiji Hayashishita, Nagoya (JP)

(73) Assignee: MITSUI CHEMICALS TOHCELLO, INC., Chiyoda-Ku, Tokyo (JP)

( * ) Notice: Subject to any disclaimer, the term of this patent is extended or adjusted under 35 U.S.C. 154(b) by 0 days.

(21) Appl. No.: 15/578,876

(22) PCT Filed: Jun. 8, 2016

(86) PCT No.: PCT/JP2016/067090
§ 371 (c)(1),
(2) Date: Dec. 1, 2017

(87) PCT Pub. No.: WO2016/199819
PCT Pub. Date: Dec. 15, 2016

(65) Prior Publication Data
US 2018/0158697 A1    Jun. 7, 2018

(30) Foreign Application Priority Data
Jun. 11, 2015  (JP) .................................. 2015-118685

(51) Int. Cl.
*H01L 21/00* (2006.01)
*H01L 21/56* (2006.01)
(Continued)

(52) U.S. Cl.
CPC .............. *H01L 21/56* (2013.01); *B32B 27/04* (2013.01); *B32B 27/08* (2013.01); *B32B 27/281* (2013.01);
(Continued)

(58) Field of Classification Search
CPC ..... H01L 21/56; H01L 23/3107; B32B 27/04; B32B 27/08; B32B 27/281; B32B 27/283;
(Continued)

(56) References Cited

U.S. PATENT DOCUMENTS

| 2005/0046021 A1 | 3/2005 | Hosokawa |
| 2006/0220262 A1 | 10/2006 | Meyer et al. |

(Continued)

FOREIGN PATENT DOCUMENTS

| EP | 1763070 A1 | 3/2007 |
| JP | H10-116929 A | 5/1998 |

(Continued)

OTHER PUBLICATIONS

Notification of Reasons for Refusal issued by the Japanese Patent Office in corresponding Japanese Patent Application No. 2017-523677 dated Dec. 18, 2018 (9 pages including partial English translation).

(Continued)

*Primary Examiner* — Mounir S Amer
*Assistant Examiner* — Alexander Belousov
(74) *Attorney, Agent, or Firm* — Buchanan, Ingersoll & Rooney PC (57) ABSTRACT

Provided are an electronic-device-protecting film used when semiconductor parts obtained by segmentation are to be sealed in the form of an array using a sealant after the semiconductor parts are rearranged, wherein the curing temperature of the sealant does not need to be adjusted downward; an electronic-device-protecting member; a (Continued)

method for manufacturing an electronic device; and a method for manufacturing a package. The electronic-device-protecting film includes a base layer and an adhesive layer, and the method includes: bonding the adhesive layer to one surface of a frame having an opening, the adhesive layer being bonded so as to cover the opening; subsequently bonding a plurality of semiconductor parts to the surface of the adhesive layer that is exposed via the opening with the semiconductor parts set apart from each other; subsequently covering the semiconductor parts and the surface of the adhesive layer with a sealant; and heat-curing the sealant.

14 Claims, 3 Drawing Sheets

(51) Int. Cl.
    *C09J 201/00* (2006.01)
    *C09J 7/20* (2018.01)
    *B32B 27/04* (2006.01)
    *H01L 23/31* (2006.01)
    *B32B 27/08* (2006.01)
    *B32B 27/28* (2006.01)
    *B32B 27/30* (2006.01)
    *B32B 27/36* (2006.01)

(52) U.S. Cl.
    CPC .......... *B32B 27/283* (2013.01); *B32B 27/308* (2013.01); *B32B 27/36* (2013.01); *C09J 7/20* (2018.01); *C09J 201/00* (2013.01); *H01L 23/3107* (2013.01); *B32B 2307/306* (2013.01); *B32B 2307/54* (2013.01); *B32B 2405/00* (2013.01); *B32B 2457/14* (2013.01)

(58) Field of Classification Search
    CPC . B32B 27/308; B32B 27/36; B32B 2307/306; B32B 2307/54; B32B 2405/00; B32B 2457/14; C09J 7/20; C09J 201/00
    See application file for complete search history.

(56) References Cited

U.S. PATENT DOCUMENTS

| | | |
|---|---|---|
| 2008/0241995 A1 | 10/2008 | Fukui et al. |
| 2009/0220783 A1 | 9/2009 | Fukui et al. |
| 2010/0300612 A1 | 12/2010 | Yamamoto et al. |
| 2011/0237050 A1 | 9/2011 | Sugimura et al. |

FOREIGN PATENT DOCUMENTS

| | | |
|---|---|---|
| JP | 2003-338535 A | 11/2003 |
| JP | 2006-287235 A | 10/2006 |
| JP | 2007-005436 A | 1/2007 |
| JP | 2009-057394 A | 3/2009 |
| JP | 2009-158817 A | 7/2009 |
| JP | 2010-278065 A | 12/2010 |
| JP | 2011-082480 A | 4/2011 |
| JP | 2012-062372 A | 3/2012 |
| JP | 2013-023684 A | 2/2013 |
| WO | WO 2015/033867 A1 | 3/2015 |

OTHER PUBLICATIONS

Extended Search Report issued by the European Patent Office in corresponding European Patent Application No. 16807525.7-1107 dated Nov. 28, 2018 (9 pages).
Notification of Reasons for Refusal issued by the Japanese Patent Office in corresponding Japanese Patent Application No. 2017-523677 dated Aug. 21, 2018 (9 pages including partial English translation).
Kapton EN Catalogue, Du Pont-Toray Co., Ltd., May 2012, pp. 2, <http://www.td-net.co.jp/products/download/documents/1207kaptonEN.pdf>.
Nenchakusei Hyoka Gijutsu, Nitto Denko Corporation, Jan. 23, 2014, pp. 1-4, <http://www.nitto.com/jp/ja/rd/base/analyze/adhesion/>.
International Search Report (PCT/ISA/210) dated Aug. 23, 2016, by the Japanese Patent Office as the International Searching Authority for International Application No. PCT/JP2016/067090.
Written Opinion (PCT/ISA/237) dated Aug. 23, 2016, by the Japanese Patent Office as the International Searching Authority for International Application No. PCT/JP2016/067090.
International Search Report (PCT/ISA/210) dated Sep. 6, 2016, by the Japanese Patent Office as the International Searching Authority for International Application No. PCT/JP2016/067705.
Written Opinion (PCT/ISA/237) dated Sep. 6, 2016, by the Japanese Patent Office as the International Searching Authority for International Application No. PCT/JP2016/067705.
Notification of Reason for Refusal issued by the Korean Intellectual Property Office in corresponding Korean Patent Application No. 10-2017-7036509 dated Dec. 24, 2018 (21 pages including partial English translation).
Decision of Refusal issued by the Japanese Patent Office in corresponding Japanese Patent Application No. 2017-523677 dated Sep. 17, 2019 (4 pages including partial English translation).
Decision of Dismissal of Amendment issued by the Japanese Patent Office in corresponding Japanese Patent Application No. 2017-523677 dated Sep. 17, 2019 (9 pages including partial English translation).
The First Office Action issued by The State Intellectual Property Office of People's Republic of China in corresponding Chinese Patent Application No. 201680033414.1 dated Aug. 23, 2019 (25 pages including partial English translation).

ELECTRONIC-DEVICE-PROTECTING FILM, ELECTRONIC-DEVICE-PROTECTING MEMBER, METHOD FOR MANUFACTURING ELECTRONIC DEVICE, AND METHOD FOR MANUFACTURING PACKAGE

TECHNICAL FIELD

The present invention relates to an electronic-device-protecting film, an electronic-device-protecting member, a method for manufacturing an electronic device, and a method for manufacturing a package. More particularly, the present invention relates to an electronic-device-protecting film used when semiconductor parts obtained by segmentation are to be sealed in the fort ii of an array using a sealant after the semiconductor parts are rearranged; an electronic-device-protecting member; a method for manufacturing an electronic device using the electronic-device-protecting film; and a method for manufacturing a package using the method for manufacturing an electronic device.

BACKGROUND ART

In recent years, a method for manufacturing an electronic device including a step of inspecting segmented semiconductor parts after segmentation of a wafer, a step of rearranging only semiconductor parts passing the inspection on a carrier, and a step of sealing the semiconductor parts in the form of an array with a sealant, is known. As this type of a manufacturing method, for example, a technology disclosed in the following Patent Literature 1 (refer to FIG. 3A to FIG. 3E, paragraphs [0028] and [0029]) is known. On the other hand, as an adhesive film to be used in handling an electronic device, a technology disclosed in the following Patent Literature 2 is known.

CITATIONS LIST

Patent Literatures

Patent Literature 1: JP 2006-287235 A
Patent Literature 2: JP 2010-278065 A

SUMMARY OF INVENTION

Technical Problems

Patent Literature 2 discloses a mounting process including a process of bonding and holding a semiconductor wafer to a ring frame with an adhesive film interposed therebetween. The adhesive film in this Patent Literature is a so-called dicing film, and a heat foamable adhesive agent is used for an adhesive layer in order to facilitate peeling a substance to be held from the dicing film.

On the other hand, as disclosed in Patent Literature 1, in the above method for manufacturing an electronic device, the semiconductor part needs to be fixed to a carrier with an adhesive film interposed therebetween in rearranging the semiconductor part on the carrier. In recent years, as the adhesive film used for a technology of Patent Literature 1, an adhesive film using a heat foamable adhesive agent, as disclosed in Patent Literature 2, is used.

In accordance with the method of Patent Literature 1, this method includes a sealing step of sealing a plurality of segmented semiconductor parts as one using a sealant after rearranging segmented semiconductor parts on the adhesive film. As the sealant used in doing so, a thermosetting sealant is used widely. Therefore, if sealing is performed on the adhesive film using the heat foamable adhesive agent of Patent Literature 2, there is a possibility that foaming of the adhesive layer is initiated in thermosetting. In order to avoid this problem, in the current sealant, sometimes countermeasures for initiation of foaming of the adhesive agent at a curing temperature of the sealant are taken by adjusting the curing temperature of the sealant downward.

However, when the curing temperature of the sealant is lowered, it is apprehensive that curing of the sealant may become insufficient to deteriorate durability and reliability of the resulting electronic device. In other words, a problem that a requirement of lowering a thermosetting temperature of the sealant and a requirement of adequately achieving heat resistance of the electronic device are mutually contradictory arises.

The present invention was made in view of the aforementioned problem, and it is an object of the present invention to provide an electronic-device-protecting film used when semiconductor parts obtained by segmentation are to be sealed in the form of an array using a sealant after the semiconductor parts are rearranged, wherein the curing temperature of the sealant does not need to be adjusted downward; an electronic-device-protecting member; a method for manufacturing an electronic device; and a method for manufacturing a package.

Solutions to Problems

The present invention includes the following items.

[1] An electronic-device-protecting film which is used in a method for manufacturing an electronic device and includes a base layer and an adhesive layer, wherein the method includes: bonding the adhesive layer of the electronic-device-protecting film to one surface of a frame having an opening, the adhesive layer being bonded so as to cover the opening; subsequently bonding a plurality of semiconductor parts to the surface of the adhesive layer that is exposed via the opening with the semiconductor parts set apart from each other; subsequently covering the semiconductor parts and the surface of the adhesive layer with a sealant; and heat-curing the sealant to obtain an electronic device in which the semiconductor parts are sealed in an array configuration, and wherein the ratio $R_E$ (=E'(160)/E'(50)) of the tensile elastic modulus E'(160) of the base layer at 160° C. to the tensile elastic modulus E'(50) of the base layer at 50° C. is such that $0.05 < R_E < 1$.

[2] The electronic-device-protecting film according to the above [1], wherein the adhesive constituting the adhesive layer has the storage elastic modulus G'(150) at 150° C. of $1 \times 10^4$ to $500 \times 10^4$ Pa.

[3] The electronic-device-protecting film according to the above [1] or [2], wherein the adhesive layer has an adhesive force to a silicon wafer of 0.1 to 10 N/25 mm which is measured according to JIS K 0237.

[4] The electronic-device-protecting film according to any one of the above [1] to [3], wherein the base layer includes one or two or more resins selected from the group consisting of polyimide, polyethylene naphthalate and polyethylene terephthalate.

[5] A method for manufacturing an electronic device including:
a film bonding step of bonding an adhesive layer of an electronic-device-protecting film to one surface of a frame having an opening, the adhesive layer being bonded so as to cover the opening;

a semiconductor-part bonding step of bonding a plurality of semiconductor parts to the surface of the adhesive layer that is exposed via the opening with the semiconductor parts set apart from each other;

a sealant-covering step of covering the semiconductor parts and the surface of the adhesive layer with a sealant; and a heat-curing step of heat-curing the sealant to obtain an electronic device in which the semiconductor parts are sealed in an array configuration, wherein the electronic-device-protecting film includes a base layer and the adhesive layer, and in the base layer, the ratio $R_E$ (=E'(160)/E'(50)) of the tensile elastic modulus E'(160) at 160° C. to the tensile elastic modulus E'(50) at 50° C. is such that $0.05<R_E<1$.

[6] The method for manufacturing an electronic device according to the above [5], wherein the adhesive constituting the adhesive layer has the storage elastic modulus G'(150) at 150° C. of $1\times10^4$ to $500\times10^4$ Pa.

[7] The method for manufacturing an electronic device according to the above [5] or [6], wherein the adhesive layer has an adhesive force to a silicon wafer of 0.1 to 10 N/25 mm which is measured according to JIS K 0237.

[8] The method for manufacturing an electronic device according to any one of the above [5] to [7], wherein the base layer includes one or two or more resins selected from the group consisting of polyimide, polyethylene naphthalate and polyethylene terephthalate.

[9] The method for manufacturing an electronic device according to any one of the above [5] to [8] further including an interconnection-layer forming step of forming an interconnection layer on the electronic device in which the semiconductor parts are sealed in an array configuration.

[10] The method for manufacturing an electronic device according to any one of the above [5] to [9] further including a segmenting step of separating, into segments, the electronic device in which the semiconductor parts are sealed in an array configuration on which the interconnection layer is formed.

[11] A method for manufacturing a package including a mounting step of mounting the electronic device according to the above [10] on a substrate.

[12] An electronic-device-protecting member which is used in a method for manufacturing an electronic device, and includes a frame having an opening and an electronic-device-protecting film bonded to one surface of the frame so as to cover the opening, wherein the electronic-device-protecting film includes a base layer and an adhesive layer, the adhesive layer is bonded to one surface of the frame, and the method for manufacturing an electronic device includes: bonding a plurality of semiconductor parts to the surface of the adhesive layer that is exposed via the opening of the electronic-device-protecting member with the semiconductor parts set apart from each other; subsequently covering the semiconductor parts and the surface of the adhesive layer with a sealant; and heat-curing the sealant to obtain an electronic device in which the semiconductor parts are sealed in an array configuration, and wherein the ratio $R_E$ (=E'(160)/E'(50)) of the tensile elastic modulus E'(160) of the base layer constituting the electronic-device-protecting film at 160° C. to the tensile elastic modulus E'(50) of the base layer at 50° C. is such that $0.05<R_E<1$.

[13] The electronic-device-protecting member according to the above [12], wherein the adhesive constituting the adhesive layer has the storage elastic modulus G'(150) at 150° C. of $1\times10^4$ to $500\times10^4$ Pa.

[14] The electronic-device-protecting member according to the above [12] or [13], wherein the adhesive layer has an adhesive force to a silicon wafer of 0.1 to 10 N/25 mm which is measured according to JIS Z 0237.

[15] The electronic-device-protecting member according to any one of the above [12] to [14], wherein the base layer is selected from the group consisting of polyimide, polyethylene naphthalate and polyethylene terephthalate.

[16] A method for manufacturing an electronic device comprising:

an electronic-device-protecting member forming step of forming an electronic-device-protecting member by bonding an adhesive layer of an electronic-device-protecting film to one surface of a frame having an opening, the adhesive layer being bonded so as to cover the opening;

a semiconductor-part bonding step of bonding a plurality of semiconductor parts to the surface of the adhesive layer that is exposed via the opening with the semiconductor parts set apart from each other;

a sealant-covering step of covering the semiconductor parts and the surface of the adhesive layer with a sealant; and a heat-curing step of heat-curing the sealant to obtain an electronic device in which the semiconductor parts are sealed in an array configuration, wherein the electronic-device-protecting film includes a base layer and the adhesive layer, and in the base layer, the ratio $R_E$ (=E'(160)/E'(50)) of the tensile elastic modulus E'(160) at 160° C. to the tensile elastic modulus E'(50) at 50° C. is such that $0.05<R_E<1$.

[17] The method for manufacturing an electronic device according to the above [16], wherein the adhesive constituting the adhesive layer has the storage elastic modulus G'(150) at 150° C. of $1\times10^4$ to $500\times10^4$ Pa.

[18] The method for manufacturing an electronic device according to the above [16] or [17], wherein the adhesive layer has an adhesive force to a silicon wafer of 0.1 to 10 N/25 mm which is measured according to JIS Z 0237.

[19] The method for manufacturing an electronic device according to any one of the above [16] to [18], wherein the base layer includes one or two or more resins selected from the group consisting of polyimide, polyethylene naphthalate and polyethylene terephthalate.

[20] The method for manufacturing an electronic device according to any one of the above [16] to [19] further including an interconnection-layer forming step of forming an interconnection layer on the electronic device in which the semiconductor parts are sealed in an array configuration.

[21] The method for manufacturing an electronic device according to any one of the above [16] to [20] further including a segmenting step of separating, into segments, the electronic device in which the semiconductor parts are sealed in an array configuration on which the interconnection layer is formed.

[22] A method for manufacturing a package including a mounting step of mounting the electronic device according to the above [21] on a substrate.

Advantageous Effects of Invention

According to the electronic-device-protecting film, the electronic-device-protecting member, the method for manufacturing an electronic device, and the method for manufacturing a package of the present invention, the curing temperature of the sealant does not need to be adjusted downward when semiconductor parts obtained by segmentation are to be sealed in the form of an array using a sealant after the semiconductor parts are rearranged. Therefore, an electronic device particularly having excellent thermal properties and high durability can be obtained.

DESCRIPTION OF EMBODIMENTS

Hereinafter, the present invention will be described with reference to drawings. Subjects shown herein are illustrative one and one for describing embodiments of the present invention exemplarily, and are described for the purpose of providing one believed to be explanation in which the principles and conceptual characteristics of the invention can be understood most effectively and without any difficulty. In this point, the present invention shows clearly that the embodiments are necessary for fundamental comprehension of the present invention and how some embodiments of the present invention are embodied in practice by an explanation in connection with drawings without intending indication of a structural detail of the present invention above a certain level to those skilled in the art.

[1] Electronic-Device-Protecting Film

Figure 2:
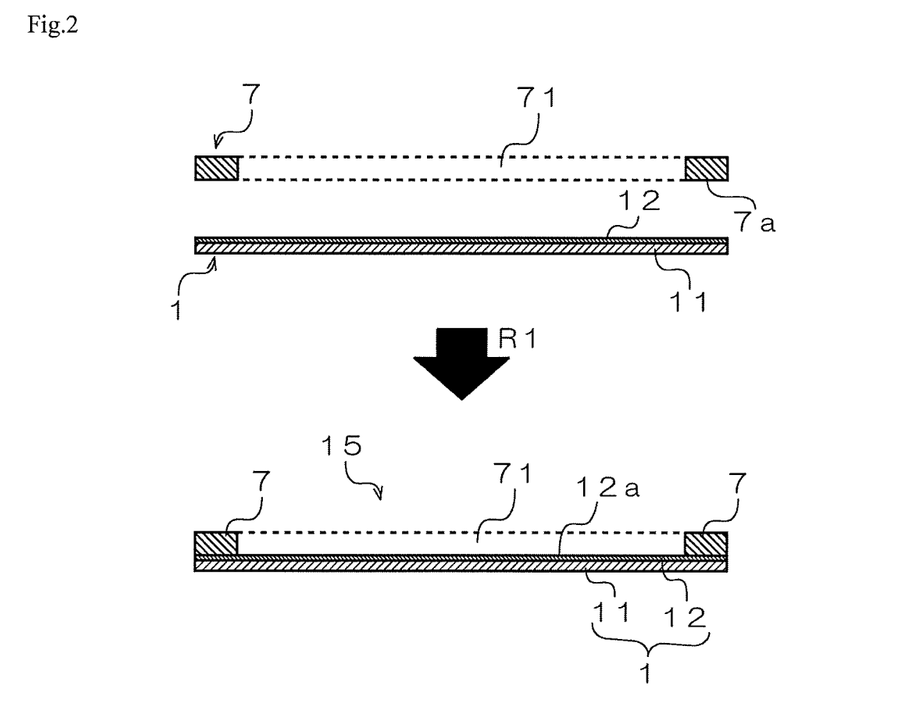
FIG. 2 is an illustrative drawing explaining a film bonding step according to the present method for manufacturing an electronic device.

The electronic-device-protecting film 1 of the present invention is an electronic-device-protecting film used in a method for manufacturing an electronic device. The method for manufacturing an electronic device is a method in which after an adhesive layer 12 of an electronic-device-protecting film 1 is bonded to one surface 7a of a frame 7 having an opening 71 so as to cover the opening 71 of the frame 7, a plurality of semiconductor parts 20 are bonded to the surface 12a of the adhesive layer 12 that is exposed via the opening 71 with the semiconductor parts 20 set apart from each other, subsequently the semiconductor parts 20 and the surface 12a of the adhesive layer 12 are covered with a sealant 30; and then the sealant 30 is heat-cured to obtain an electronic device 50 in which the semiconductor parts 20 are sealed in an array configuration (refer to FIG. 2 and FIG. 3). The method for manufacturing an electronic device will be described later.

(1) Base Layer

Figure 1:
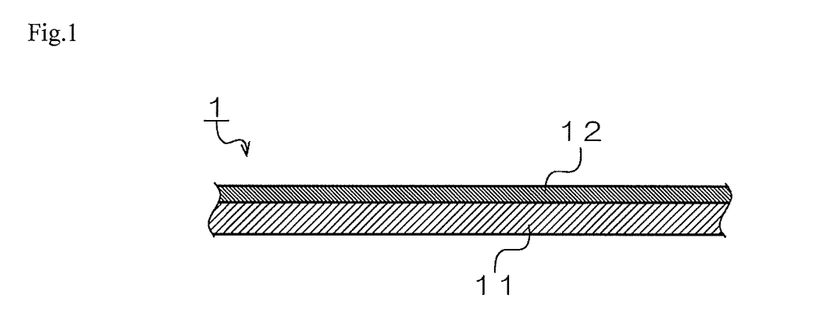
FIG. 1 is an illustrative drawing explaining a cross-section of an example of the present electronic-device-protecting film.

The electronic-device-protecting film 1 includes a base layer 11 and an adhesive layer 12 (refer to FIG. 1). In the base layer 11 of the electronic-device-protecting film 1, the ratio $R_E$ (=E'(160)/E'(50)) of the tensile elastic modulus E'(160) at 160° C. to the tensile elastic modulus E'(50) at 50° C. is such that $0.05<R_E<1$.

Herein, "E'(160)" represents the tensile elastic modulus of the base layer 11 at 160° C., and "E' (50)" represents the tensile elastic modulus of the base layer 11 at 50° C. Furthermore, the ratio $R_E$ represents a ratio (E'(160)/E'(50)) of the E'(160) to the E'(50).

Accordingly, the ratio $R_E$ being such that $0.05<R_E<1$ means that the tensile elastic modulus of the base layer 11 at 160° C. is more than 5% and less than 100% of the tensile elastic modulus of the base layer 11 at 50° C. According to the electronic-device-protecting film 1 of the present invention, the characteristic that the base layer 11 is such that $0.05<R_E<1$ enables to obtain an electronic device 50 in which the semiconductor parts 20 are sealed in the form of an array using a sealant commonly used in this field without adjusting downward a curing temperature of the sealant in the above-mentioned method for manufacturing an electronic device.

The ratio $R_E$ may be such that $0.05<R_E<1$, and is preferably such that $0.10 \le R_E \le 0.95$, more preferably such that $0.20 \le R_E \le 0.90$, and particularly preferably such that $0.30 \le R_E \le 0.85$.

The tensile elastic modulus E' (Pa) is not particularly limited, and the tensile elastic modulus E' (50) is preferably such that $1 \times 10^8 \le E'(50) \le 1 \times 10^{10}$, and more preferably such that $1 \times 10^9 \le E'(50) \le \times 10^9$.

On the other hand, the tensile elastic modulus E' (160) is preferably such that $5 \times 10^6 \le E'(160) \le 1 \times 10^{10}$, and more preferably such that $5 \times 10^7 \le E'(160) \le 5 \times 10^9$.

In addition, the tensile elastic modulus E' of the base layer 11 at each temperature is measured by a method described in examples described later.

Further, a thickness of the base layer 11 is not particularly limited, and it is preferably 5 μm or more and 150 μm or less, more preferably 10 μm or more and 100 μm or less, and particularly preferably 15 μm or more and 50 μm or less.

Furthermore, a coefficient of thermal expansion is not particularly limited, and the coefficient of thermal expansion at temperatures of 50° C. to 150° C. is preferably 1 ppm/K or more and 100 ppm/K or less, and more preferably 10 ppm/K or more and 95 ppm/K or less.

It is only necessary that the base layer 11 can support the adhesive layer 12, and has the above-mentioned ratio $R_E$, and a material of the base layer 11 is not particularly limited. A material constituting the base layer 11 is preferably a resin.

Examples of such a resin include polyimide-based resins (polyimide, polyetherimide, polyamide-imide, etc.), polyester-based resins (polyolefin terephthalate, polyolefin naphthalate, etc.), polyamide-based resins (nylon, etc.), polyolefin-based resins (high-density polyolefin, low-density polyolefin, homopolyolefin, random polyolefin, etc.), polysulfone-based resins, polyethersulfone-based resins, polyether ether ketone-based resins, polyphenylene sulfide-based resins, polyurethane resins (thermoplastic polyurethane elastomer, etc.), and the like. These resins may be used singly, or may be used in combination of two or more thereof.

Among these resins, the polyimide-based resins and/or the polyester-based resins are preferred.

Examples of the polyimide-based resins include polyimide, polyetherimide, polyamide-imide and the like. Among these, polyimide is preferred. Specific examples of polyimide include "AURUM (trade name)" manufactured by Mitsui Chemicals, Inc., "Kapton (trade name)" manufactured by Du Pont-Torav Co., Ltd., "XENOMAX (trade name)" manufactured by TOYOBO CO., LTD., "Upilex (trade name)" manufactured by Ube Industries, Ltd., "Apical (trade name)" manufactured by KANEKA CORPORATION, "Neopulim (trade name)" manufactured by MIT- SUBISHI GAS CHEMICAL COMPANY, INC., and "Midfil (trade name)" manufactured by KURABO INDUSTRIES LTD.

On the other hand, examples of the polyester-based resins include polyethylene terephthalate, polybutylene terephthalate and the like, and polyethylene naphthalate, polybutylene naphthalate and the like. Among these, polyethylene terephthalate and/or polyethylene naphthalate is particularly preferred.

It is preferred that the material constituting the base layer 11 has a melting point of 200° C. or higher, or does not have a melting point (when the material is decomposed by heating, a decomposition temperature is 200° C. or higher). When the material constituting the base layer 11 has a melting point, the melting point is preferably 200° C. or higher and 400° C. or lower, more preferably 210° C. or higher and 350° C. or lower, and particularly preferably 220° C. or higher and 300° C. or lower.

(2) Adhesive Layer

The adhesive layer 12 is a layer formed of an adhesive, and can be disposed on only one surface of the base layer 11 or can be disposed on both surfaces of the base layer 11. The adhesive layer 12 may be disposed in direct contact with the base layer 11, or may be disposed on the base layer 11 with another layer interposed between the adhesive layer 12 and the base layer 11.

The storage elastic modulus G'(150) (Pa) at 150° C. of the adhesive constituting the adhesive layer 12 is not particularly limited, and can be such that $0.1 \times 10^4 \leq G'(150) \leq 1000 \times 10^4$, and is preferably such that $1 \times 10^4 \leq G'(150) \leq 500 \times 10^4$. When G'(150) of the adhesive layer 12 is $1 \times 10^4$ Pa or more, the adhesive deposit can be effectively prevented. On the other hand, since G'(150) of the adhesive layer 12 is $500 \times 10^4$ Pa or less, a sufficient adhesive force is attained. G'(150) is more preferably such that $2 \times 10^4 \leq G'(150) \leq 2 \times 10^6$.

Furthermore, the adhesive force of the adhesive layer 12 is not particularly limited; however, it is preferred that the adhesive force to a silicon wafer (measured in an environment of a temperature of 23° C. and a relative humidity of 50%), measured according to JIS Z 0237, at the time when the adhesive layer 12 is peeled off from the surface of a silicon wafer after being bonded to the surface of a silicon wafer and left standing for 60 minutes, is 0.1 to 10 N/25 mm. When the adhesive force is in the above-mentioned range, an adhesive deposit at the time when the sealed electronic device is peeled can be suppressed while ensuring good adhesiveness to the semiconductor part. The adhesive force is more preferably 0.2 N/25 mm or more and 9 N/25 mm or less, and still more preferably 0.3 N/25 mm or more and 8 N/25 mm or less.

A thickness (thickness of one surface side of the base layer 11) of the adhesive layer 12 is not particularly limited, and it is preferably 0.5 μm or more and 50 μm or less, more preferably 1 μm or more and 35 μm or less, and particularly preferably 3 μm or more and 25 μm or less.

The adhesive may have characteristics described above, and any material may be used. The adhesive usually includes at least an adhesive main agent. Examples of the adhesive main agent include an acrylic adhesive agent, a silicone-based adhesive agent, a rubber-based adhesive agent and the like. These resins may be used singly, or may be used in combination of two or more thereof. Among these adhesive agents, the acrylic adhesive agent is preferred.

Examples of the acrylic adhesive agent include a homopolymer of an acrylate compound, a copolymer of an acrylate compound and a comonomer, and the like. These resins may be used singly, or may be used in combination of two or more thereof.

Further, examples of the acrylate compound include methyl acrylate, ethyl acrylate, butyl acrylate, 2-ethylhexyl acrylate and the like. These resins may be used singly, or may be used in combination of two or more thereof.

Furthermore, examples of the comonomer include vinyl acetate, acrylonitrile, acrylamide, styrene, methyl (meth)acrylate, (meth)acrylic acid, hydroxyethyl methacrylate, dimethylaminoethyl methacrylate, glycidyl methacrylate, maleic anhydride and the like.

Furthermore, the adhesive may contain a cross-linking agent other than the adhesive main agent. Examples of the cross-linking agent include epoxy-based cross-linking agents (pentaerythritol polyglycidyl ether, etc.), isocyanate-based cross-linking agents (diphenylmethane diisocyanate, tolylene diisocyanate, tetramethylene diisocyanate, hexamethylene diisocyanate, polyisocyanate, etc.). These resins may be used singly, or may be used in combination of two or more thereof. When the cross-linking agent is contained in the adhesive, the content of the cross-linking agent is preferably set to 10 parts by mass or less with respect to 100 parts by mass of the whole adhesive. The adhesive force of the adhesive layer can be adjusted by the content of the cross-linking agent. Specifically, a method described in JP 2004-115591 A can be employed.

The adhesive agent may be an energy-curable adhesive which is cured by an energy ray, or may be an energy-non-curing adhesive which is not cured by an energy ray.

When the adhesive is the energy-curable adhesive, the adhesive can be cured to reduce the adhesive force thereof by irradiating the adhesive with energy rays. Thus, the adhesive deposit to the electronic device can be prevented with more reliability when the electronic device (electronic device in which the semiconductor parts are sealed in an array configuration) and the electronic-device-protecting film are separated.

The energy-curable adhesive may be one which is cured with any energy ray. Examples of the energy ray include ultraviolet rays, electron rays, infrared rays and the like. These energy rays may be used singly, or may be used in combination of two or more thereof. Specific examples thereof include an ultraviolet curable adhesive which is cured with ultraviolet rays.

When the adhesive is an energy-curable adhesive, the adhesive can contain a compound having a carbon-carbon double bond in a molecule (hereinafter, referred to as merely "curable compound") and a photo-polymerization initiator capable of initiating the polymerization of the curable compound in response to the energy rays other than the above-mentioned adhesive main agent. The curable compound is preferably a monomer, an oligomer and/or a polymer which has a carbon-carbon double bond in a molecule and can be cured through radical polymerization. Specific examples of the curable compound include trimethylolpropane tri(meth)acrylate, pentaerythritol tri(meth)acrylate, dipentaerythritol hexa(meth)acrylate, tetraethyleneglycol di(meth)acrylate, 1,6-hexanediol di(meth)acrylate, neopentylglycol di(meth)acrylate and the like. These resins may be used singly, or may be used in combination of two or more thereof. When the curable compound is contained in the adhesive, the content of the curable compound is preferably 0.1 to 20 parts by mass with respect to 100 parts by mass of the adhesive.

In addition, the carbon-carbon double bond in a molecule may be contained by inclusion in a molecule of the adhesive main agent described above. That is, for example, the adhesive main agent can be an energy-curable polymer having a carbon-carbon double bond in a side chain. As described above, when the adhesive main agent has a curable structure in a molecule, the curable compound may be mixed, or does not have to be mixed.

On the other hand, as the photo-polymerization initiator, a compound capable of producing a radical by irradiation of energy rays is preferred. Specific examples of such a photo-polymerization initiator include acetophenone-based photo-polymerization initiators (methoxyacetophenone, etc.), α-ketol compounds (4-(2-hydroxyethoxy)phenyl (2-hydroxy-2-propyl) ketone, α-hydroxycyclohexyl phenyl ketone, etc.), ketal-based compounds (benzyl dimethyl ketal, etc.), benzoin-based photo-polymerization initiators (benzoin, benzoin alkyl ethers (benzoin methyl ether, benzoin isopropyl ether, benzoin isobutyl ether,), etc.), benzophenone-based photo-polymerization initiators (benzophenone, benzoylbenzoic acid, etc.), aromatic ketals (benzyl dimethyl ketal, etc.), and the like. These resins may be used singly, or may be used in combination of two or more thereof. When the photo-polymerization initiator is contained in the adhesive, the content of the photo-polymerization initiator is preferably set to 5 to 15 parts by mass with respect to 100 parts by mass of the adhesive.

(3) Other Layers

The electronic-device-protecting film 1 of the present invention may include only the base layer 11 and the adhesive layer 12, or may include other layers. Examples of other layers include a projection-depression absorbing layer which can absorb a projection and depression shape of a bonding plane to make a film surface smooth, an interface-strength improving layer which improves strength of an interface with the adhesive, and a migration preventive layer which suppress the migration of a low molecular weight component from a base material to an adhesive surface. These resins may be used singly, or may be used in combination of two or more thereof.

(4) Manufacturing of Electronic-Device-Protecting Film

The electronic-device-protecting film of the present invention may be manufactured by any method, and the method is not particularly limited. Specifically, the film can be manufactured by a method such as a co-extrusion method, an extrusion lamination method, an adhesive lamination method or an application method. Among these methods, the co-extrusion method is a method in which a molten resin serving as the adhesive layer 12 is laminated on a molten resin serving as the base layer 11 by co-extrusion to manufacture an electronic-device-protecting film.

The extrusion lamination method is a method of laminating a molten resin serving as the adhesive layer 12 on the base layer 11 by extrusion to manufacture an electronic-device-protecting film.

Furthermore, the application method is a method of laminating a molten resin serving as the adhesive layer 12 on the base layer 11 by application or coating to manufacture an electronic-device-protecting film. When the energy-curable adhesive is used as an adhesive constituting the adhesive layer 12, the application method is preferably used.

Further, the adhesive lamination method is a method of laminating the adhesive layer 12 on the base layer 11 through thermocompression bonding, an adhesive or hot-melt to manufacture an electronic-device-protecting film.

These methods may be used singly, or may be used in combination of two or more thereof.

(5) Semiconductor Part as Bonding Object

Examples of the semiconductor part which can be suitably bonded to the electronic-device-protecting film 1 of the present invention include semiconductor parts using a silicon substrate, a sapphire substrate, a germanium substrate, a germanium-arsenic substrate, a gallium-phosphorus substrate, or a gallium-arsenic-aluminum substrate. Examples of the semiconductor part using the sapphire substrate among these semiconductor parts include a semiconductor part in which a semiconductor layer (GaN, etc.) is laminated on the sapphire substrate. These semiconductor parts are usually obtained by cutting out of a semiconductor wafer. Circuits may be formed on the surfaces of these semiconductor parts, or do not have to be formed. Examples of the circuits include a wiring, a capacitor, a diode, a transistor and the like. These circuits may be used singly, or may be used in combination of two or more thereof.

Particularly, these semiconductor parts are preferably each a semiconductor part whose initial defect is eliminated by screening such as a burn-in test.

[2] Electronic-Device-Protecting Member

The electronic-device-protecting member 15 of the present invention is an electronic-device-protecting member used in a method for manufacturing an electronic device. The method for manufacturing an electronic device is a method in which a plurality of semiconductor parts 20 are bonded to the surface 12a of an adhesive layer 12 that is exposed via an opening 71 of an electronic-device-protecting member 15 with the semiconductor parts 20 set apart from each other, subsequently the semiconductor parts 20 and the surface 12a of the adhesive layer 12 are covered with a sealant 30; and then the sealant 30 is heat-cured to obtain an electronic device 50 in which the semiconductor parts 20 are sealed in an array configuration (refer to FIG. 2 and FIG. 3). The method for manufacturing an electronic device will be described later.

Further, the electronic-device-protecting member 15 of the present invention includes a frame 7 having an opening 17, and an electronic-device-protecting film 1 bonded to one surface 7a of the frame 7 so as to cover the opening 17. Then, the electronic-device-protecting film 1 includes a base layer 11 and an adhesive layer 12. The electronic-device-protecting film 1 is bonded to one surface 7a of the frame 7 by the adhesive layer 12. To the electronic-device-protecting film 1, the aforementioned description in the electronic-device-protecting film 1 of the present invention can be applied as-is.

On the other hand, as the frame 7, for example, a ring frame can be used. An outline of the frame 7 is not particularly limited, and it can appropriately have a shape responsive to necessity. For example, a circle, a quadrangle or the like can be employed. Similarly, an outline of the opening 71 is also not particularly limited, and can appropriately have a shape responsive to necessity, and for example, a circle, a quadrangle or the like can be employed. Also, a material constituting the frame 7 is not limited, and a resin and/or metal or the like can be used.

Further, heating may be performed as required when the adhesive layer 12 of the electronic-device-protecting film 1 is bonded to one surface 7a of the frame 7 so as to cover the opening 71 of the frame 7.

[2] Method for Manufacturing Electronic Device

The method for manufacturing an electronic device of the present invention includes a film bonding step (electronicdevice-protecting member forming step) (R1), a semiconductor-part bonding step (R2), a sealant-covering step (R3), and a heat-curing step (R4).

The film bonding step (electronic-device-protecting member forming step) R1 (refer to FIG. 2) is a step of bonding an adhesive layer 12 of an electronic-device-protecting film 1 to one surface 7a of a frame 7 having an opening 71, the adhesive layer 12 being bonded so as to cover the opening 71 of the frame 7. Among these, the frame 7 is as described above. In this step, a heated film 1 may be bonded to the frame 7 as required.

The semiconductor-part bonding step R2 (refer to FIG. 3) is a step of bonding a plurality of semiconductor parts 20 to the surface 12a of the adhesive layer 12 that is exposed via the opening 71 with the semiconductor parts 20 set apart from each other.

Figure 3:
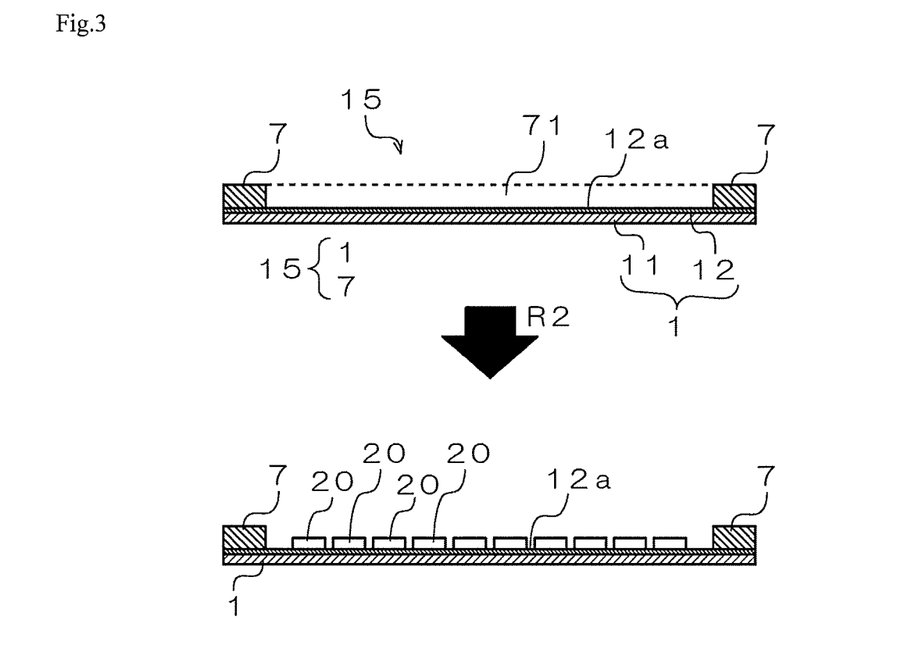
FIG. 3 is an illustrative drawing explaining a semiconductor-part bonding step according to the present method for manufacturing an electronic device.

The semiconductor parts 20 is as described above ((5) of [1]). When the semiconductor part 20 further requires the formation of the circuit or the like, a circuit forming surface (a surface on which the circuit is to be formed) may be bonded to the surface 12a of the adhesive layer 12, or a circuit non-forming surface (a surface on which the circuit is not formed) may be bonded to the surface 12a of the adhesive layer 12. Among these, the former is preferred.

The sealant-covering step R3 (refer to FIG. 4) is a step of covering semiconductor parts 20 and a surface 12a of an adhesive layer 12 with a sealant 30.

Figure 4:
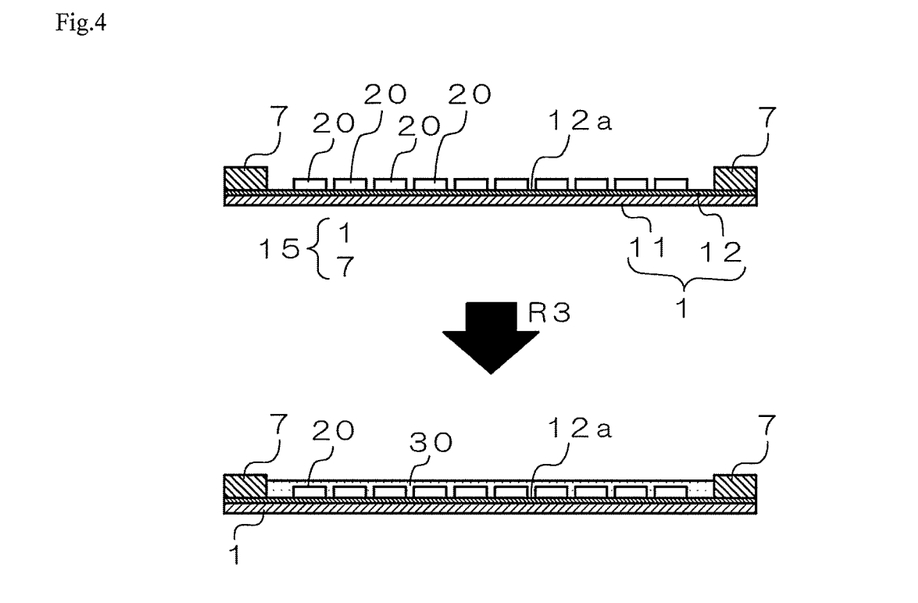
FIG. 4 is an illustrative drawing explaining a sealant-covering step according to the present method for manufacturing an electronic device.

As the sealant 30, a publicly known resin for a sealant, such as an epoxy resin, can be used. In the present invention, a heat-curable sealant 30 which is cured by heating is used.

The sealant 30 may be a liquid sealant, a bulky sealant or a film-like sealant, or furthermore may be a sealant having other forms. In the case of the liquid sealant 30 of these sealants, the semiconductor part 20 can be covered with the sealant 30 (not-yet-cured sealing material) by application, spin coating, or the like. Further, in the case of the bulky sealant 30, the semiconductor part 20 can be covered with the sealant 30 (not-yet-cured sealing material) by pressing with a pressing plate (which can be heated as required). Furthermore, in the case of the film-like sealant 30, the semiconductor part 20 can be covered with the sealant 30 (not-yet-cured sealing material) by bonding the film-like sealant 30.

The heat-curing step R4 (refer to FIG. 5) is a step of heat-curing the sealant 30 to obtain an electronic device 50 in which the semiconductor parts 20 are sealed in an array configuration. That is, the electronic device 50 includes at least the semiconductor part 20 and the cured sealing material 30'.

Figure 5:
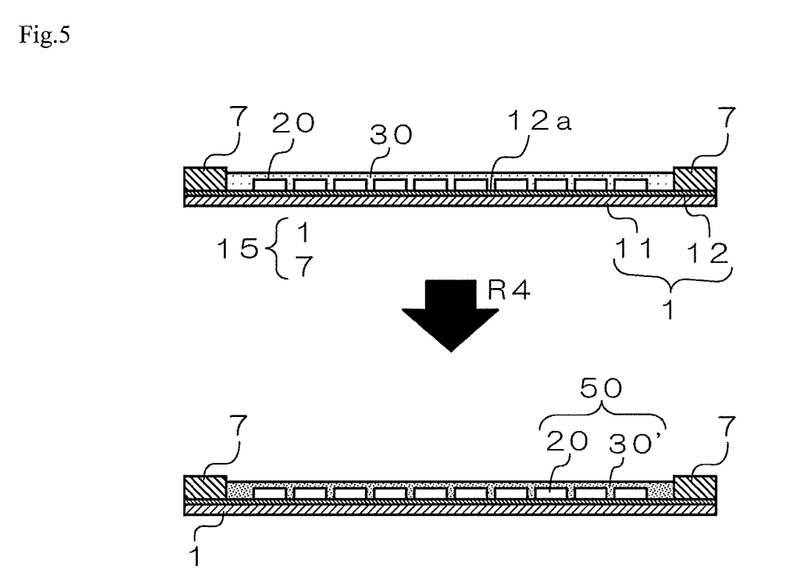
FIG. 5 is an illustrative drawing explaining a heat-curing step according to the present method for manufacturing an electronic device.

In this step, the sealant 30 is cured by performing required heating in accordance with the above-mentioned sealants 30. A curing temperature in doing so is usually 100° C. or higher, preferably 100° C. or higher and 180° C. or lower, and more preferably 120° C. or higher and 150° C. or lower.

In the method of the present invention, it is possible to include other steps other than the above-mentioned steps. Examples of other steps include an interconnection-layer forming step of forming an interconnection layer on the electronic device 50 in which the semiconductor parts 20 are sealed in an array configuration, a segmenting step of separating, into segments, the electronic device 51 sealed in an array configuration on which the interconnection layer is formed, and the like.

Examples of the above-mentioned interconnection layer include an interconnection layer which is required for mounting on a substrate for mounting an electronic device. Specific examples thereof include a mounting bump (solder ball), various electrode pads such as a plane electrode pad and a tape electrode pad, connecting wires between these electrode pads and semiconductor part circuits, and the like. These resins may be used singly, or may be used in combination of two or more thereof.

A method for manufacturing a package of the present invention is characterized by including a mounting step of mounting, on a substrate, a segmented electronic device obtained by separating, into segments, the electronic device 51 having an interconnection layer formed thereon and sealed in an array configuration. That is, the electronic device 51 having an interconnection layer formed thereon and sealed in an array configuration is separated into segments with a required size by dicing, and the resulting segmented electronic devices are mounted. In this segmentation, the electronic device is separated into segments so that at least one semiconductor part is contained in one electronic device; however, the segmentation includes the case in which the electronic device is separated into segments so that two or more semiconductor parts are contained in one electronic device.

[3] Method for Manufacturing Package

A method for manufacturing a package of the present invention is characterized by including a mounting step of mounting, on a substrate (substrate for mounting an electronic device), a segmented electronic device obtained by separating, into segments, the electronic device 51 having an interconnection layer formed thereon and sealed in an array configuration. That is, the electronic device 51 having an interconnection layer formed thereon and sealed in an array configuration is separated into segments with a required size by dicing, and the resulting segmented electronic devices are mounted. In this segmentation, the electronic device is separated into segments so that at least one semiconductor part is contained in one electronic device; however, the segmentation includes the case in which the electronic device is separated into segments so that two or more semiconductor parts are contained in one electronic device.

EXAMPLES

Hereinafter, the present invention will be specifically described by way of examples.

[1] Manufacturing of Electronic-Device-Protecting Film

Example 1

(1) Base Layer

As a base layer 11, a polyimide (PI) film (manufactured by Du pont-Toray Du Pont-Torav Co., Ltd., trade name "Kapton 100V", coefficient of thermal expansion at 50° C. to 200° C.: 27 ppm/K, density: 1420 kg/m$^3$, not having a melting point) having a thickness of 25 μm was used.

Using the base layer 11, the tensile elastic modulus E' was measured with a dynamic mechanical analysis (DMA) apparatus (product name: RSA-3, manufactured by TA Instruments Co.). Specifically, a sample size was set to a width of 10 mm, a distance between chucks was set to 20 mm, and measurement was carried out from −20° C. to 200° C. under the conditions of a frequency of 1 Hz and a temperature raising rate of 5° C./min, and the tensile elastic modulus at each temperature was read from the resulting data. That is, a value at 50° C. was defined as a tensile elastic modulus E'(50), and a value at 160° C. was defined as a tensile elastic modulus E'(160). As a result of this, E'(50) was $3 \times 10^9$ Pa, and E'(160) was $2 \times 10^9$ Pa. Consequently, the ratio $R_E$ (=E'(160)/E'(50)) was 0.66.

(2) Adhesive Layer

An ultraviolet curable acrylic adhesive agent self-manufactured was formed into a thickness of 10 μm as an adhesive layer 12. The storage elastic modulus G'(150) at 150° C. of the adhesive layer 12 was $2.8 \times 10^4$ Pa. Measurement was carried out using a dynamic mechanical analysis apparatus (product name: ARES, manufactured by TA Instruments Co.). Specifically, a sample prepared by forming the above-mentioned ultraviolet curable acrylic adhesive agent into a thickness of 500 μm, was set in the dynamic mechanical analysis apparatus, and a storage elastic modulus was measured at a measurement frequency of 1 Hz while heating the sample at a temperature raising rate of 3° C./min from −40° C. to 200° C. using a parallel plate type attachment having a diameter of 8 mm. After the measurement, a value of the storage elastic modulus G' at 150° C. was read from the resulting storage elastic modulus-temperature curve.

(3) Lamination of Adhesive Layer on Base Layer

The adhesive layer 12 obtained in the above (2) was laminated on one surface of the base layer 11 obtained in the above (1) to obtain an electronic-device-protecting film 1 of Example 1.

Using the obtained electronic-device-protecting film 1 of Example 1, an adhesive force was measured by the following method according to JIS Z 0237. That is, the obtained electronic-device-protecting film was formed into a test piece having a width of 25 mm, and the adhesive layer 12 of the electronic-device-protecting film was bonded to a 4-inch silicon wafer while applying a pressure with a rubber roll of about 2 kg. Then, the test piece was left standing for 60 minutes in an environment of a temperature of 23° C. and a relative humidity of 50%. Thereafter, an adhesive force at the time when the test piece was peeled off from the silicon wafer at a peeling speed of 300 mm/min in a direction of 180°, was measured. The measurement of the adhesive force was performed twice, and an average value thereof was taken as "adhesive force" (N/25 mm). As a result of this, the adhesive force of the electronic-device-protecting film 1 of Example 1 was 6.2 N/25 mm.

Example 2

As a base layer 11, the same polyimide (PI) film as in Example 1 was used.

As an adhesive layer 12, a non-curing acrylic adhesive agent (A) having a thickness of 10 μm was used. G'(150) of the adhesive layer 12 measured in the same manner as in Example 1 was $160 \times 10^4$ Pa.

As with Example 1, the adhesive layer 12 was laminated on the base layer 11 to obtain an electronic-device-protecting film 1 of Example 2. Using the obtained electronic-device-protecting film 1 of Example 2, the adhesive force measured in the same manner as in Example 1 was 0.7 N/25 mm.

Example 3

As a base layer 11, the same polyimide (PI) film as in Example 1 was used.

As an adhesive layer 12, a non-curing acrylic adhesive agent (B) having a thickness of 10 μm was used. G'(150) of the adhesive layer 12 measured in the same manner as in Example 1 was $42 \times 10^4$ Pa.

As with Example 1, the adhesive layer 12 was laminated on the base layer 11 to obtain an electronic-device-protecting film 1 of Example 3. Using the obtained electronic-device-protecting film of Example 3, the adhesive force measured in the same manner as in Example 1 was 2.7 N/25 mm.

Example 4

As a base layer 11, the same polyimide (PI) film as in Example 1 was used.

As an adhesive layer 12, a non-curing acrylic adhesive agent (C) having a thickness of 10 μm was used. G'(150) of the adhesive layer 12 measured in the same manner as in Example 1 was $0.9 \times 10^4$ Pa.

As with Example 1, the adhesive layer 12 was laminated on the base layer 11 to obtain an electronic-device-protecting film 1 of Example 4. Using the obtained electronic-device-protecting film of Example 4, the adhesive force measured in the same manner as in Example 1 was 9.7 N/25 mm.

Example 5

As a base layer 11, a polyethylene naphthalate (PEN) film (manufactured by Teijin DuPont Films Japan Ltd., trade name "Teonex", coefficient of thermal expansion at 50° C. to 200° C.: 13 ppm/K, density: 1360 kg/m³, melting point: 269° C.) having a thickness of 25 μm was used. The tensile elastic modulus E'(50) of the base layer 11 measured in the same manner as in Example 1 was $3 \times 10^9$ Pa, E'(160) was $1 \times 10^9$ Pa, and the ratio $R_E$ was 0.33.

As an adhesive layer 12, the same adhesive layer (10 μm) as in Example 1 was used.

As with Example 1, the adhesive layer 12 was laminated on the base layer 11 to obtain an electronic-device-protecting film 1 of Example 5. Using the obtained electronic-device-protecting film of Example 5, the adhesive force measured in the same manner as in Example 1 was 6.2 N/25 mm.

Example 6

As a base layer 11, a polybutylene terephthalate (PBT) film (manufactured by TORAY INDUSTRIES, INC., trade name "TORAYCON", coefficient of thermal expansion at 50° C. to 200° C.: 94 ppm/K, density: 1310 kg/m³, melting point: 224° C.) extruded into a thickness of 50 μm was used. Using the base layer 11, the tensile elastic modulus E'(50) measured in the same manner as in Example 1 was $3 \times 10^8$ Pa, E'(160) was $1 \times 10^8$ Pa, and the ratio $R_E$ was 0.33.

As an adhesive layer 12, the same adhesive layer (10 μm) as in Example 1 was used.

As with Example 1, the adhesive layer 12 was laminated on the base layer 11 to obtain an electronic-device-protecting film 1 of Example 6. Using the obtained electronic-device-protecting film of Example 6, the adhesive force measured in the same manner as in Example 1 was 6.2 N/25 mm.

Example 7

As a base layer 11, a polyethylene terephthalate (PET) film (manufactured by TORAY INDUSTRIES, INC., trade name "Lumirror", coefficient of thermal expansion at 50° C. to 200° C.: 15 ppm/K, density: 1400 kg/m³, melting point: 258° C.) having a thickness of 50 μm was used. The tensile elastic modulus E'(50) of the base layer 11 measured in the same manner as in Example 1 was 4×10$^9$ Pa, E'(160) was 4×10$^8$ Pa, and the ratio $R_E$ was 0.1.

As an adhesive layer 12, the same adhesive layer (10 μm) as in Example 1 was used.

As with Example 1, the adhesive layer 12 was laminated on the base layer 11 to obtain an electronic-device-protecting film 1 of Example 7. Using the obtained electronic-device-protecting film of Example 7, the adhesive force measured in the same manner as in Example 1 was 6.2 N/25 mm.

Comparative Example 1

As a base layer 11, a polypropylene film (manufactured by Prime Polymer Co., Ltd., trade name "F107BV", coefficient of thermal expansion at 50° C. to 120° C.: 110 ppm/K, density: 910 kg/m$^3$, melting point: 160° C.) extruded into a thickness of 100 μm was used. The tensile elastic modulus E'(50) of the base layer 11 measured in the same manner as in Example 1 was 7×10$^8$ Pa, E'(160) was 3×10$^6$ Pa, and the ratio $R_E$ was 0.004.

As an adhesive layer 12, the same adhesive layer (10 μm) as in Example 1 was used.

As with Example 1, the adhesive layer 12 was laminated on the base layer 11 to obtain an electronic-device-protecting film 1 of Comparative Example 1. Using the obtained electronic-device-protecting film of Comparative Example 1, the adhesive force measured in the same manner as in Example 1 was 6.2 N/25 mm.

Comparative Example 2

As a base layer 11, a polyethylene film (manufactured by DUPONT-MITSUI POLYCHEMICALS CO., LTD., trade name "MIRASON 11P", coefficient of thermal expansion at 50° C. to 100° C.: 120 ppm/K, density: 917 kg/m$^3$, melting point: 107° C.) extruded into a thickness of 100 μm was used. The tensile elastic modulus E'(50) of the base layer 11 measured in the same manner as in Example 1 was 6×10$^7$ Pa, and E'(160) was unmeasurable by break of the base layer. Consequently, the ratio $R_E$ was less than 0.005.

As an adhesive layer 12, the same adhesive layer (10 μm) as in Example 1 was used.

As with Example 1, the adhesive layer 12 was laminated on the base layer 11 to obtain an electronic-device-protecting film 1 of Comparative Example 2. Using the obtained electronic-device-protecting film of Comparative Example 2, the adhesive force measured in the same manner as in Example 1 was 6.2 N/25 mm.

[2] Test Using Electronic-Device-Protecting Film

The following two types of tests were performed using the electronic-device-protecting films of Examples 1 to 7 and Comparative Examples 1 to 2.

(1) Test 1 (Evaluation of Heat Resistance)

A side of the base 11 of each of the electronic-device-protecting films of Examples 1 to 7 and Comparative Examples 1 to 2 obtained in the above [1] was fixed, by suction, to a vacuum suction type wafer table (chuck table) set at 150° C., and the electronic-device-protecting film was detached from the wafer table through vacuum break after a lapse of 10 minutes. In doing so, ease of detaching from the wafer table was rated according the following criteria, and the result of rating was shown in Table "○" . . . The film can be detached without difficulty.

"x" . . . Film weld to the wafer table is found and detaching is not easy.

(2) Test 2 (Evaluation of Adhesive Deposit)

A side of the adhesive layer 12 of each of the electronic-device-protecting films of Examples 1 to 7 and Comparative Examples 1 to 2 obtained in the above [1] was bonded to a mirror surface of a silicon wafer of 4-inch size, a wafer surface was placed on a hot plate of 150° C. and held for 10 minutes, and then the hot plate was cooled. Subsequently, using a high-pressure mercury lamp, the electronic-device-protecting film was irradiated with light having a wavelength of 365 nm so that a cumulative light quantity was 1080 mJ/cm$^2$, and then the electronic-device-protecting film was peeled off from the silicon wafer. In doing so, an adhesive deposit to the silicon wafer was visually rated according to the following criteria, and the result of rating was shown in Table 1.

"○" . . . The adhesive deposit to the silicon wafer is not visually found.

"x" . . . The adhesive deposit to the silicon wafer is visually found.

[3] Effect of Examples

It is found that since the ratio $R_E$ in the base layer 11 of the electronic-device-protecting film 1 is such that 0.05<$R_E$<1, an electronic device can be manufactured using a wafer table heated at 150° C. That is, since the curing temperature of the sealant can be set to 150° C. when semiconductor parts obtained by segmentation are to be sealed in the form of an array using a sealant after the semiconductor parts are rearranged, the sealant can be

TABLE 1

|  |  |  | Example | | | | | | | Comparative Example | |
|---|---|---|---|---|---|---|---|---|---|---|---|
|  |  |  | 1 | 2 | 3 | 4 | 5 | 6 | 7 | 1 | 2 |
| Electronic-Device-Protecting Film | Base Layer | Material | PI | PI | PI | PI | PEN | PBT | PET | PP | PE |
|  |  | Thickness (μm) | 25 | 25 | 25 | 25 | 25 | 50 | 50 | 100 | 100 |
|  |  | $R_E$ E'(160)/E'(50) | 0.7 | 0.7 | 0.7 | 0.7 | 0.3 | 0.3 | 0.1 | 0.004 | <0.005 |
|  | Adhesive Layer | Curing Method | UV curing | non-curing | non-curing | non-curing | UV curing | UV curing | UV curing | UV curing | UV curing |
|  |  | G'(150) (10$^4$Pa) | 2.8 | 160 | 42 | 0.9 | 2.8 | 2.8 | 2.8 | 2.8 | 2.8 |
|  |  | Adhesive Force (N/25 mm) | 6.2 | 0.7 | 2.7 | 9.7 | 6.2 | 6.2 | 6.2 | 6.2 | 6.2 |
| Evaluation |  | Heat Resistance (test 1) | ○ | ○ | ○ | ○ | ○ | ○ | ○ | X | X |
|  |  | Adhesive Deposit (test 2) | ○ | ○ | ○ | X | ○ | ○ | ○ | ○ | ○ | adequately cured, and the durability and reliability of the resulting electronic device can be improved.

Further, it is found that the adhesive deposit can be prevented even after heating at 150° C. by setting the storage elastic modulus G' (150) of the adhesive constituting the adhesive layer 12 to $1 \times 10^4$ to $500 \times 10^4$ Pa. That is, it is found that as described above, even though a curing temperature of the sealant is set to 150° C., the adhesive deposit is prevented to reduce expense in time and effort of removing the adhesive deposit, and therefore the electronic device can be effectively manufactured.

In addition, in the present invention, the invention is not limited to the above-mentioned specific embodiments, and widely different embodiments of this invention may be made within the scope of the invention according to the object and the use of the invention.

INDUSTRIAL APPLICABILITY

The electronic-device-protecting film, the electronic-device-protecting member, the method for manufacturing an electronic device, and the method for manufacturing a package of the present invention are widely used in applications of electronic device manufacturing. Particularly, since the curing temperature of the sealant does not need to be adjusted downward when semiconductor parts obtained by segmentation are to be sealed in the form of an array using a sealant after the semiconductor parts are rearranged, the present invention is suitably used for the object of obtaining an electronic device having excellent thermal properties and high durability.

REFERENCE SIGNS LIST

1: electronic-device-protecting film,
15: electronic-device-protecting member,
11: base layer
12: adhesive layer
12a: surface of an adhesive layer (surface of an adhesive layer 12 that is exposed via an opening 71)
20: semiconductor part
30: sealant (sealing material)
50: electronic device
7: frame
7a: one surface of a frame
71: opening of a frame
R1: film bonding step (electronic-device-protecting member forming step)
R2: semiconductor-part bonding step
R3: sealant-covering step
R4: heat-curing step

The invention claimed is:

1. A method for manufacturing an electronic device comprising:
a film bonding step of bonding an adhesive layer of an electronic-device-protecting film to one surface of a frame having an opening, the adhesive layer being bonded so as to cover the opening;
a semiconductor-part bonding step of bonding a plurality of semiconductor parts to the surface of the adhesive layer that is exposed via the opening with the semiconductor parts set apart from each other;
a sealant-covering step of covering the semiconductor parts and the surface of the adhesive layer with a sealant; and
a heat-curing step of heat-curing the sealant to obtain an electronic device, wherein a side of a base layer of the electronic-device-protecting film is fixed by suction to a heated vacuum suction chuck table, in which the semiconductor parts are sealed in an array configuration, wherein the electronic-device-protecting film includes the base layer and the adhesive layer, and in the base layer, a thickness of the base layer is 15 µm or more and 50 µm or less, the ratio $R_E$ (=E'(160)/E'(50)) of the tensile elastic modulus E'(160) at 160° C. to the tensile elastic modulus E'(50) at 50° C. is such that $0.05 < R_E < 1$ and $1 \times 10^8 \leq E'(50) \leq 1 \times 10^{10}$.

2. The method for manufacturing an electronic device according to claim 1, wherein the adhesive constituting the adhesive layer has the storage elastic modulus G'(150) at 150° C. of $1 \times 10^4$ to $500 \times 10^4$ Pa.

3. The method for manufacturing an electronic device according to claim 1, wherein the adhesive layer has an adhesive force to a silicon wafer of 0.1 to 10 N/25 mm which is measured according to JIS K 0237.

4. The method for manufacturing an electronic device according to claim 1, wherein the base layer includes one or two or more resins selected from the group consisting of polyimide, polyethylene naphthalate and polyethylene terephthalate.

5. The method for manufacturing an electronic device according to claim 1 further comprising an interconnection-layer forming step of forming an interconnection layer on the electronic device in which the semiconductor parts are sealed in an array configuration.

6. The method for manufacturing an electronic device according to claim 1 further comprising a segmenting step of separating, into segments, the electronic device in which the semiconductor parts are sealed in an array configuration on which the interconnection layer is formed.

7. A method for manufacturing a package comprising a mounting step of mounting the electronic device according to claim 6 on a substrate.

8. A method for manufacturing an electronic device comprising:
an electronic-device-protecting member forming step of forming an electronic-device-protecting member by bonding an adhesive layer of an electronic-device-protecting film to one surface of a frame having an opening, the adhesive layer being bonded so as to cover the opening;
a semiconductor-part bonding step of bonding a plurality of semiconductor parts to the surface of the adhesive layer that is exposed via the opening with the semiconductor parts set apart from each other;
a sealant-covering step of covering the semiconductor parts and the surface of the adhesive layer with a sealant; and
a heat-curing step of heat-curing the sealant to obtain an electronic device, wherein a side of a base layer of the electronic-device-protecting film is fixed by suction to a heated vacuum suction chuck table, in which the semiconductor parts are sealed in an array configuration, wherein the electronic-device-protecting film includes the base layer and the adhesive layer, and in the base layer, a thickness of the base layer is 15 µm or more and 50 µm or less, the ratio $R_E$ (=E'(160)/E'(50)) of the tensile elastic modulus E'(160) at 160° C. to the tensile elastic modulus E'(50) at 50° C. is such that $0.05 < R_E < 1$ and $1 \times 10^8 \leq E'(50) \leq 1 \times 10^{10}$.

9. The method for manufacturing an electronic device according to claim 8, wherein the adhesive constituting the adhesive layer has the storage elastic modulus G'(150) at 150° C. of $1\times10^4$ to $500\times10^4$ Pa.

10. The method for manufacturing an electronic device according to claim 8, wherein the adhesive layer has an adhesive force to a silicon wafer of 0.1 to 10 N/25 mm which is measured according to JIS Z 0237.

11. The method for manufacturing an electronic device according to claim 8, wherein the base layer includes one or two or more resins selected from the group consisting of polyimide, polyethylene naphthalate and polyethylene terephthalate.

12. The method for manufacturing an electronic device according to claim 8 further comprising an interconnection-layer forming step of forming an interconnection layer on the electronic device in which the semiconductor parts are sealed in an array configuration.

13. The method for manufacturing an electronic device according to claim 8 further comprising a segmenting step of separating, into segments, the electronic device in which the semiconductor parts are sealed in an array configuration on which the interconnection layer is formed.

14. A method for manufacturing a package comprising a mounting step of mounting the electronic device according to claim 13 on a substrate.

* * * * *